(12) United States Patent
Crawford

(10) Patent No.: US 6,587,490 B2
(45) Date of Patent: Jul. 1, 2003

(54) LOW-NOISE CURRENT SOURCE DRIVER FOR LASER DIODES

(75) Inventor: Ian D. Crawford, Longwood, FL (US)

(73) Assignee: Analog Modules, INC, Longwood, FL (US)

( * ) Notice: Subject to any disclaimer, the term of this patent is extended or adjusted under 35 U.S.C. 154(b) by 0 days.

(21) Appl. No.: 09/969,339

(22) Filed: Oct. 2, 2001

(65) Prior Publication Data

US 2003/0062881 A1 Apr. 3, 2003

(51) Int. Cl.$^7$ ................................................ H01S 3/00
(52) U.S. Cl. ........................ 372/38.07; 372/38.08; 372/38.09
(58) Field of Search ..................... 372/38.07, 38.09, 372/38.08

(56) References Cited

U.S. PATENT DOCUMENTS

| | | | | |
|---|---|---|---|---|
| 4,347,610 A | * | 8/1982 | Meuleman | 372/38.07 |
| 4,484,331 A | * | 11/1984 | Miller | 372/34 |
| 4,813,048 A | * | 3/1989 | Yamane et al. | 372/38.07 |
| 5,287,372 A | * | 2/1994 | Ortiz | 372/38.07 |
| 5,410,515 A | * | 4/1995 | Bielas et al. | 356/460 |
| 5,966,395 A | * | 10/1999 | Ikeda | 372/38.01 |
| 6,097,746 A | * | 8/2000 | Noda et al. | 372/38.09 |
| 6,359,918 B1 | * | 3/2002 | Bielas | 372/38.01 |

* cited by examiner

Primary Examiner—Bao Q. Vu
(74) Attorney, Agent, or Firm—Gerald E. Linden

(57) ABSTRACT

A low-noise current source driver for a laser diode load is achieved by means of a current-regulated supply connected across the load, and a shunt regulator. The shunt regulator comprises a shunting element, a current sensing element for sensing current conducted through the load, and an error amplifier responsive to a difference between the current sensed by the current sensing element and a first reference current. The current regulator is designed to respond to a signal a signal representative of a second reference current to produce an appropriate corresponding output current. The shunting element is connected across the power supply and load, and is controlled by the error amplifier to conduct all current from the current regulated supply in excess of the first reference current. The second reference current is greater than the first reference current by an amount sufficient to ensure that noise and ripple currents cannot cause the output of the current-regulated supply to drop below the first reference current.

20 Claims, 4 Drawing Sheets

LOW-NOISE CURRENT SOURCE DRIVER FOR LASER DIODES

TECHNICAL FIELD OF THE INVENTION

The invention relates to laser power supplies and, more specifically to low-noise power supplies for laser diodes.

BACKGROUND OF THE INVENTION

In semiconductor lasers, particularly CW-operated laser diodes (Continuous Wave, or continuous mode), power supply induced noise currents manifest themselves as corresponding instabilities in output level and wavelength. Accordingly, CW laser diodes typically require an accurate, low-noise current source to achieve high stability. Due to the high power levels often required of laser power supplies, it is common practice to use switch-mode power supplies to maximize efficiency. However, it is well-known that such switching power supplies generate considerable noise and high output ripple as compared to "quieter" but less efficient linear supplies.

To overcome this problem, a linear pass element connected as a current driver is usually employed in series with "raw" power supply output and the laser diode load. An example of such an arrangement 100 is shown in FIG. 1. A voltage regulated "raw" or "bulk" power supply 102 provides power for a load comprising one or more laser diodes 104 (e.g., an array or diodes). Typically, the power supply 102 is a switching power supply. The output of the power supply 102 is smoothed by a capacitor 106. A ground-referenced current source 108 comprising a linear pass element 110, a current sensing element 112 and an error amplifier 114 controls the amount of current conducted through the diode load. The linear pass element 110, typically a FET (field-effect transistor), conducts current from the power supply 102 through the laser diode(s) 104 into the grounded current sensing element 112. A voltage develops across the current sensing element 112 in proportion to the amount of current being conducted through the laser diodes 104. The error amplifier 114 compares the sensed current to a control voltage that indicates the desired laser diode current and adjusts the current conducted by the linear pass element 110 accordingly to maintain constant current at the desired level. The filtering effect of the capacitor 106, in combination with the ripple and noise rejection of the linear current source 108, improves overall stability and minimizes power supply induced noise.

In operation, with the current source 108 conducting current through the laser diode(s) 104, energy is drawn from the capacitor 106 through the diodes, as a result of which the voltage on the capacitor falls. Therefore, the current source has to have sufficient compliance to continue to maintain current regulation as the "raw" supply voltage falls. For good efficiency, a low voltage loss across the current source is desired, but this requires a large and bulky capacitor to minimize voltage "droop".

The disadvantages of such an implementation include:
a) The power dissipated in the linear pass element 110 may be considerable, resulting in substantial heat generation and consequent inefficiency. Heat sinking and cooling may be required, resulting in a large, expensive, inefficient system.
b) All of the laser diode current flows through the linear pass element 110, requiring a high-current device with commensurate size and cost penalties.
c) Laser diodes are presently very expensive. If the series pass element 110 were to fail to a short-circuit condition, then the voltage stored on the capacitor 106 would be applied directly across the laser diode(s) 104, resulting in unregulated current flow, potentially producing excessive light output and possible diode damage.

Another example of a series-connected linear pass element being used to regulate current conducted through laser diode load is disclosed in U.S. Pat. No. 5,287,372 ("ORTIZ"), incorporated in its entirety by reference herein. ORTIZ discloses a zero-current, switched, full wave quasi-resonant converter that provides a current to directly drive the laser diode. Referring to FIG. 2 of ORTIZ, a linear pass element 24 (Q1) is connected in series with the laser diode load 31 and is used to regulate the current conducted therethrough. The laser diode driver circuit described in ORTIZ suffers from the disadvantages described hereinabove with respect to the current driver circuit arrangement of FIG. 1.

BRIEF DESCRIPTION (SUMMARY) OF THE INVENTION

It therefore is a general object of the present invention to provide an improved technique for driving laser diodes.

It is a further object of the present invention to create a smaller, less expensive, low-noise current driver for laser diodes without the efficiency loss of a series-connected linear pass element.

It is a further object of the present invention to create a low-noise current driver for laser diodes that can employ less expensive, lower-current devices while maintaining good load regulation.

According to the invention, a low-noise current source driver for a laser diode load comprises a current-regulated supply connected across the load, and a shunt regulator. The shunt regulator comprises a shunting element, a current sensing element for sensing current conducted through the load, and an error amplifier responsive to a difference between the current sensed by the current sensing element and a signal representative of a first reference current. The current regulator is designed to respond to a signal representative of a second reference current to produce an appropriate corresponding output current. The shunting element is connected across the power supply and load, and is controlled by the error amplifier to conduct all current from the current regulated supply in excess of the first reference current. The second reference current is greater than the first reference current. The shunting element may be a field-effect transistor (FET) or a bipolar transistor. The current sensing element may be a small-value resistor or a Hall-effect device.

Generally speaking, the second reference current is always greater than the first reference current by an amount sufficient to ensure that ripple and noise currents cannot cause the current-regulated supply output to dip below the first reference current. This is accomplished in one of three ways:
- the second reference current is made greater than the first reference current by a fixed amount;
- the second reference current is made greater than the first reference current by a fixed proportion (e.g., percentage); or
- the second reference current is made greater than the first reference current by an amount equal to the sum of a fixed proportion of the first reference current and a fixed amount.

Other objects, features and advantages of the invention will become apparent in light of the following description thereof.

BRIEF DESCRIPTION OF THE DRAWINGS

Reference will be made in detail to preferred embodiments of the invention, examples of which are illustrated in the accompanying drawings. The drawings are intended to be illustrative, not limiting. Although the invention will be described in the context of these preferred embodiments, it should be understood that it is not intended to limit the spirit and scope of the invention to these particular embodiments.

Often, similar elements throughout the drawings may be referred to by similar references numerals. For example, the element 199 in a figure (or embodiment) may be similar or analogous in many respects to an element 199A in another figure (or embodiment). Such a relationship, if any, between similar elements in different figures or embodiments will become apparent throughout the specification, including, if applicable, in the claims and abstract. In some cases, similar elements may be referred to with similar numbers in a single drawing. For example, a plurality of elements 199 may be referred to as 199A, 199B, 199B, etc.

Figure 1:
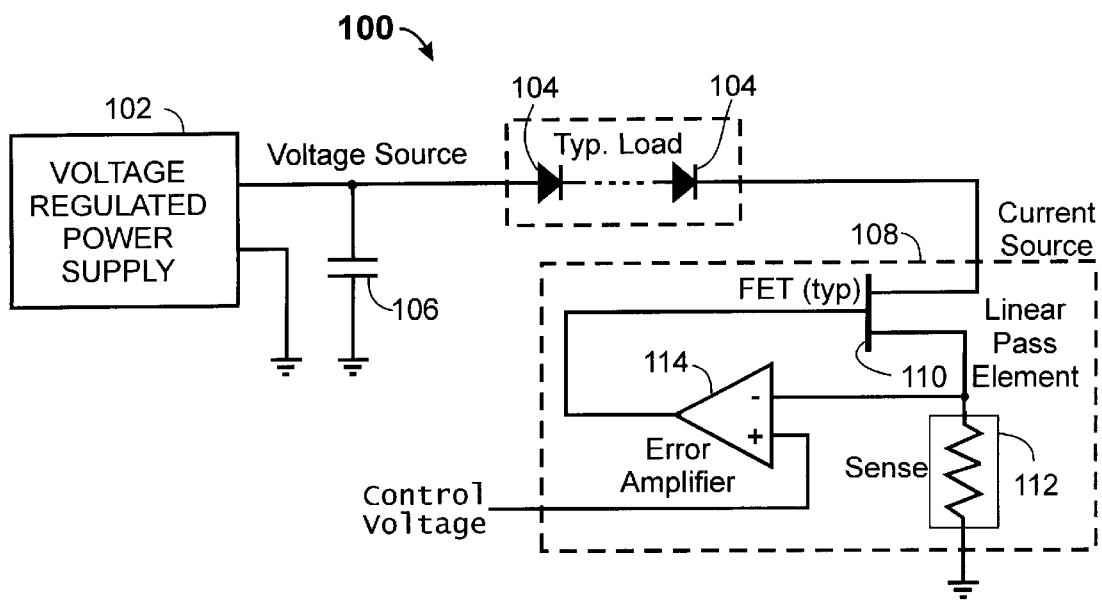
Figure 2:
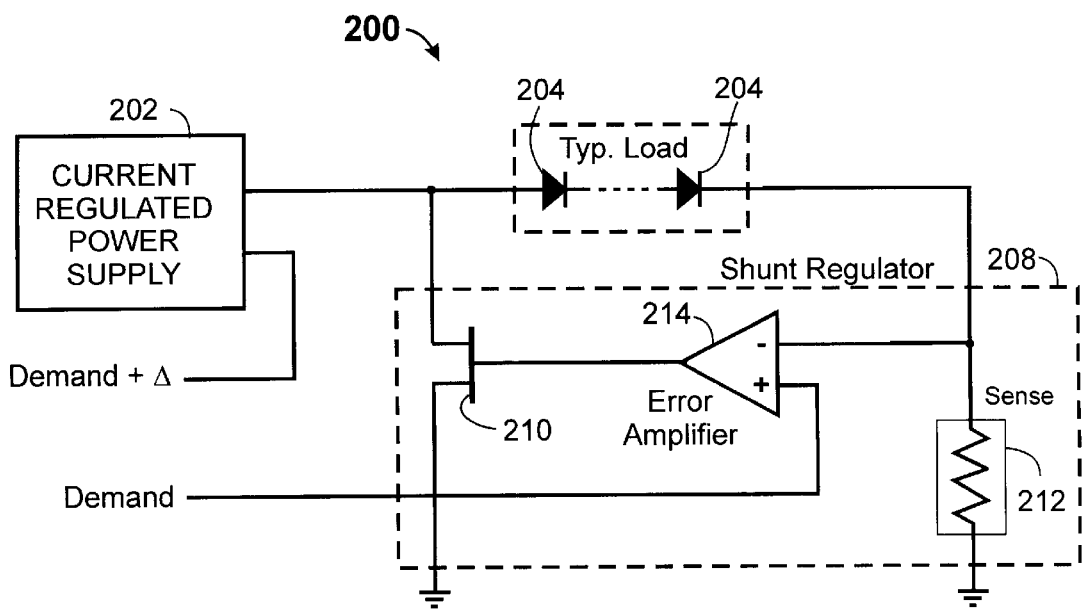
Figure 3A:
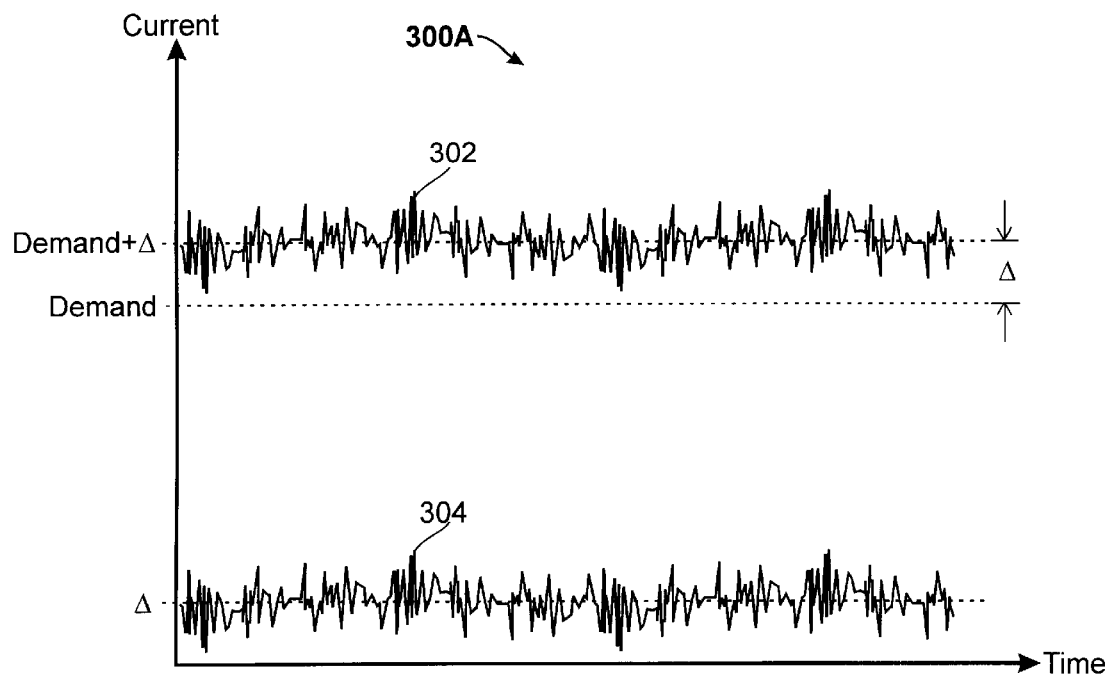
Figure 3B:
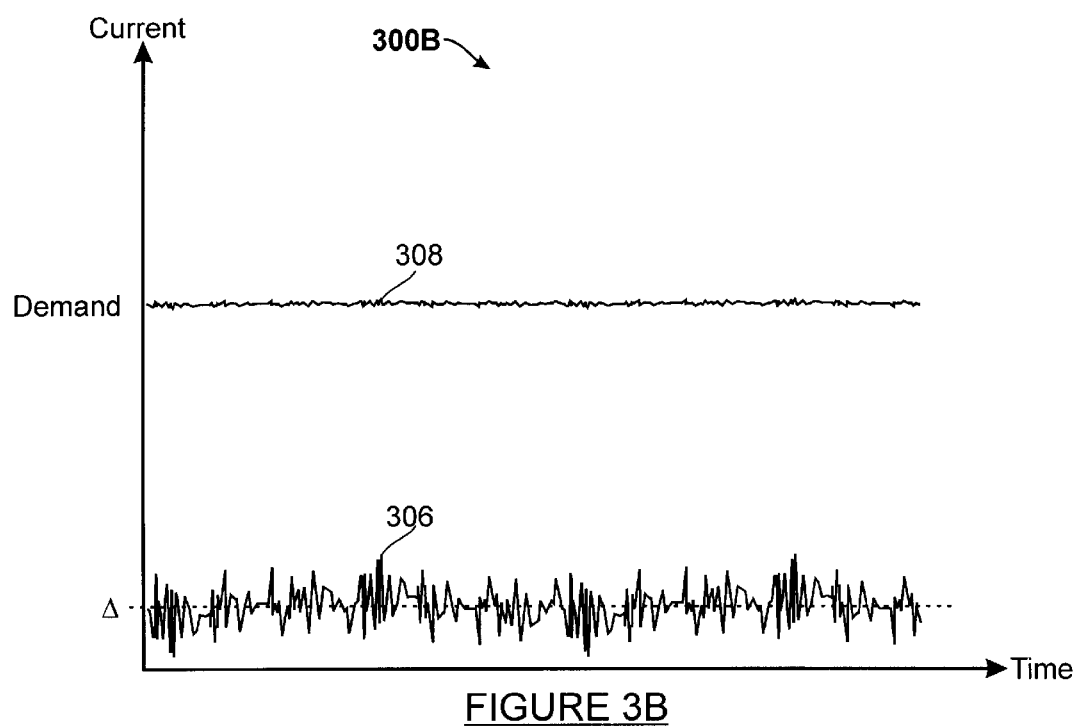
Figure 4A:
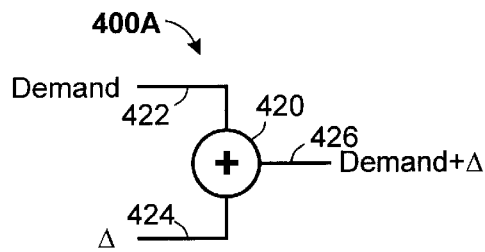
Figure 4B:
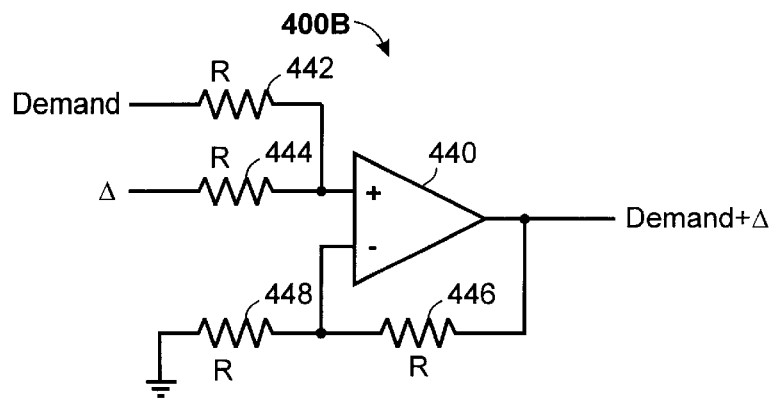
Figure 5A:
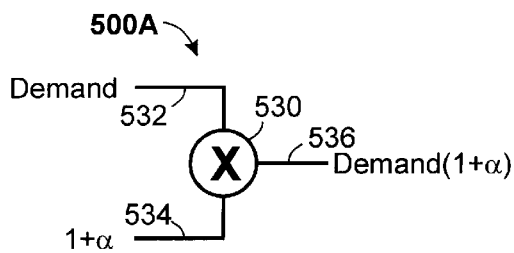
Figure 5B:
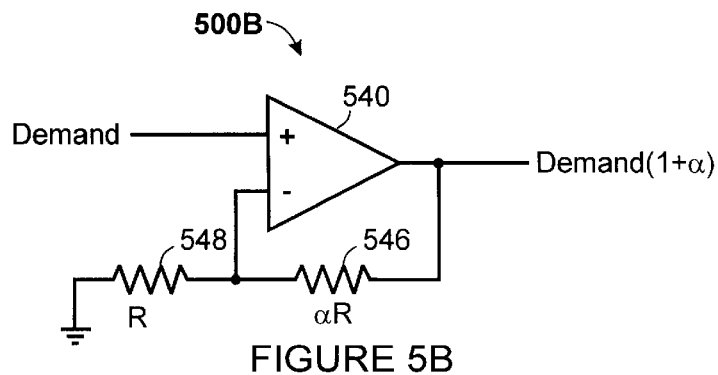
Figure 6A:
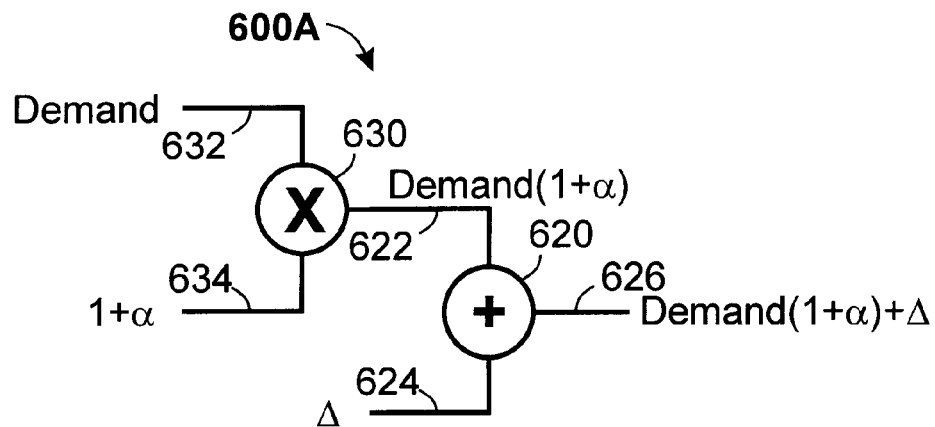
Figure 6B:
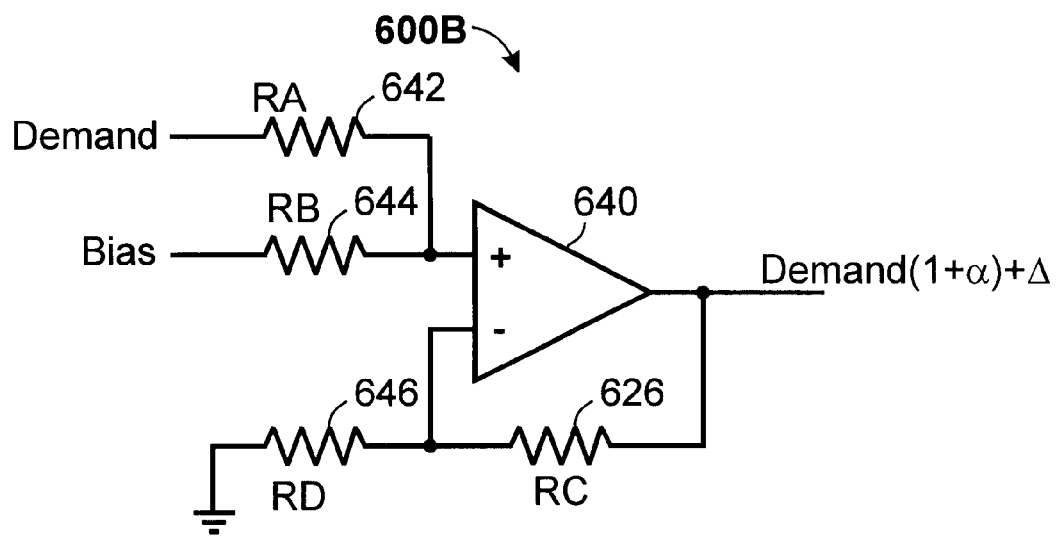

The structure, operation, and advantages of the present preferred embodiment of the invention will become further apparent upon consideration of the following description taken in conjunction with the accompanying drawings, wherein:

FIG. 1 is a schematic diagram of a prior-art current driver for laser diodes;

FIG. 2 is a schematic diagram of a current driver for laser diodes, according to the invention;

FIGS. 3A and 3B are graphs illustrating one aspect of the current driver, according to the invention;

FIG. 4A is a block diagram demonstrating a technique for generation of an offset demand signal, according to the invention;

FIG. 4B is a schematic diagram of a circuit realization of the block diagram of FIG. 4A, according to the invention;

FIG. 5A is a block diagram demonstrating another technique for generation of an offset demand signal, according to the invention;

FIG. 5B is a schematic diagram of a circuit realization of the block diagram of FIG. 5A, according to the invention;

FIG. 6A is a block diagram demonstrating another technique for generation of an offset demand signal, according to the invention; and FIG. 6B is a schematic diagram of a circuit realization of the block diagram of FIG. 6A, according to the invention.

DETAILED DESCRIPTION OF THE INVENTION

As a general proposition, the present inventive technique provides an efficient low-noise current source driver for laser diodes by "shunting" noise currents around the load rather than by attempting to "block" noise currents from passing through the load using a series-connected pass element. According to the invention generally, a current source laser diode driver comprises a "bulk" current supply set to provide slightly more current than is required by a laser diode load and a shunting element such as an FET connected across the laser diode load. An error amplifier measures the current in the laser diode load, and controls the shunting element to "shunt" any load current in excess of the required load current.

FIG. 2 is a schematic diagram of a low-noise current source laser diode driver 200, according to the invention. A current-regulated power supply 202 (contrast 102) supplies current to a load comprising one or more laser diodes 204 (compare 104). A shunt regulator 208 comprising a shunting element 210 (which may be an FET; compare 110), a current sensing element 212 (compare 112) and an error amplifier 214 (compare 114) is connected across (around) the laser diodes 204, as shown. The error amplifier 214 measures the difference in current between a desired current ("Demand") through the laser diodes 204 and the current passing through the laser diodes, as measured by the current sensing element 210. The current sensing element 212 is suitably a small-value resistor or a Hall-effect sensing device. The current-regulated power supply 202 is set to provide slightly more current than what is required by the laser diode load 204. This is accomplished by providing a reference signal ("Demand+$\Delta$") to power supply 202 that exceeds the desired load current ("Demand") by a small amount "$\Delta$". The amount of current "$\Delta$" in excess of the required current is determined such that it slightly exceeds the amount of ripple and current noise present in the output of the current-regulated power supply 202. By shunting essentially any and all current in excess of the required load current ("Demand"), the laser diodes 204 are provided with clean, substantially noise-free current at the required level.

The current-regulated power supply 202 may be implemented using any of a wide variety of different circuit topologies. Typically, however, it is implemented by controlling the duty cycle of one or more power switching elements according to an error signal derived from the difference between the desired output current ("Demand+$\Delta$", in this case) and actual output current. Typically, output current pulses from such a switching (switch-mode) current supply are smoothed by a low-pass filtering element such as a capacitor.

The connections between of the elements in FIG. 2 are as illustrated. The power supply 202 has an output which supplies current to one of two terminals of the laser diode load 204. The other terminal of the laser diode load 204 connects to ground via the current sensing element 212, and to an input of the error amplifier 214. The other input of the error amplifier 214 receives the signal indicative of desired current ("Demand"). The output of the error amplifier 214 is provided to the gate of the shunting element (FET) 210. The source and drain of the FET 210 are connected between the output of the power supply 202 and ground. The power supply 202 has an input for receiving a signal indicative of the reference signal ("Demand+$\Delta$").

The operation of current source driver 200 of the present invention is illustrated in FIGS. 3A and 3B.

FIG. 3A is a graph 300A showing the current output 302 of the current-regulated power supply 202 and the signal 304 at the output of the error amplifier 214. The output current 302 includes noise and ripple currents that cause its actual current output to deviate from its desired output current ("Demand+$\Delta$" indicated by a dashed line). Note that the amount "$\Delta$" by which the current output 302 of the power supply 202 is set to exceed the desired load current ("Demand") is selected such that the minimum excursions of the current output 302, including noise, will not dip below the desired load current. That is, "$\Delta$" is chosen to be at least as great as, preferably just greater than, the anticipated magnitude of the noise and ripple present in the current output 302 of the current-regulated power supply 202.

The signal 304 is generally representative of the "excess" load current (i.e., current in excess of the required current ("Demand") as measured by the error amplifier 214 and is used to drive the shunting element 210 to conduct (divert) said "excess" load current around the laser diodes 204.

FIG. 3B is a graph 300B showing the current 306 conducted (shunted) through the shunting element 210 under control of the error amplifier 214 and the load current 308 through the laser diodes 204. By shunting all of the excess current through the shunting element 210, the load current 308 through the laser diodes 204 is accurately controlled to the desired level ("Demand") with minimal noise.

Note that for proper operation, the regulated current output of the power supply must always be maintained (slightly) greater than the desired current in the diode load. The gain of the error amplifier 214 may be enhanced at high frequencies to cancel out any high frequency noise current in the diode load current.

The advantages of this approach include:

a) A high current series pass element is not required.
b) The efficiency is high because the switching power supply drives the load directly.
c) The ripple and noise is "skimmed" from the power supply output current and is bypassed around the laser diode load. Only "smooth" current flows into the diode load. Only noise and ripple currents (plus a small margin) are conducted by the shunting element.
d) The diode driver is more reliable due to the elimination of the high power series element along with its related heat.
e) The power supply can be designed to limit the maximum current (and therefore, the maximum power) into the diode load. In the worst case, if the shunting element were to fail to an open-circuit condition, power into the laser diode load would still be maintained at non-damaging levels by the current supply. If the shunting element were to fail to a short-circuit condition, this would not normally cause damage to the laser diodes.

Optionally, when the required load current (Demand) is set to zero, the power supply can be commanded to zero as well, but the pass element can be turned on slightly to absorb any slight noise current output from the power supply and prevent it from being conducted through the load. Those of ordinary skill in the art will understand that this is readily accomplished by setting (Demand+$\Delta$) equal to zero such that the reference input to the error amplifier (Demand) is slightly negative. In this condition, the error amplifier will cause the shunt element to absorb any and all noise and/or leakage current from the power supply output, preventing it from being conducted through the laser diode load. Those of ordinary skill in the art will also understand that there are alternative methods of accomplishing essentially the same result.

Three general approaches to controlling the output of the current-regulated power supply are now described:

1) The power supply can be commanded (controlled) to provide an output current that is a fixed amount "$\Delta$" greater than the desired load current. A benefit of this approach is its simplicity. This approach is shown and described hereinbelow with respect to FIGS. 4A and 4B.
2) The power supply can be commanded to provide an output current that is a greater than the desired load current by a fixed portion "$\alpha$" of the desired load current. A benefit of this approach is its efficiency. Switching noise and ripple tend to increase roughly in proportion to the current output setting, so this technique tends to maintain the output current of the power supply at the lowest possible setting, thereby minimizing the amount of current that must be conducted by the shunting element. This approach is shown and described hereinbelow with respect to FIGS. 5A and 5B.
3) The power supply can be commanded to provide an output current that is the sum of a fixed amount "$\Delta$" greater than the desired load current and a fixed portion "$\alpha$" of the desired load current. A benefit of this approach is combined efficiency and reliability. This approach is shown and described hereinbelow with respect to FIGS. 6A and 6B.

FIG. 4A is a block diagram 400A of a circuit for generating a controlling signal for the power supply. A signal representative of the desired load current ("Demand") is presented at a first input 422 of a summing element 420. A signal representative of an offset amount "$\Delta$" is presented at a second input 424 of the summing element 420. The summing element 420 produces an output signal 426 representative of the sum of the two signals at its inputs 422 and 424.

FIG. 4B is a schematic diagram of a circuit realization 400B generally equivalent to the block diagram of FIG. 4A. An operational amplifier 440 has a first input resistor 442 and a second input resistor 444 connected to a positive input ("+") thereof. A signal representative of the desired load current ("Demand") is provided to the operational amplifier 440 via the first input resistor 442 and a signal representative of an offset amount "$\Delta$" is provided via the second input resistor 444. A first feedback network resistor 446 is connected between an output of the operational amplifier 440 and a negative input ("−") thereof. A second feedback network resistor 448 is connected between the negative input ("−") and ground. In this configuration, assuming all equal-valued resistors ("R"), a signal at the output of the operational amplifier is representative of the sum of the two input signals ("Demand+$\Delta$").

FIG. 5A is a block diagram 500A of another circuit for generating a controlling signal for the power supply. A signal representative of the desired load current ("Demand") is presented at a first input 532 of a scaling element 530. A scale factor ("1+$\alpha$") is applied via a second input 534 of the scaling element 530. The scaling element 530 produces an output signal 536 representative of the desired load current multiplied by the scale factor ("Demand(1+$\alpha$)").

FIG. 5B is a schematic diagram of a circuit realization 500B generally equivalent to the block diagram of FIG. 5A. An operational amplifier 540 has a signal representative of the desired load current ("Demand") connected to a positive input ("+") thereof. A first feedback network resistor 546 ("$\alpha$R") is connected between an output of the operational amplifier 440 and a negative input ("−") thereof. A second feedback network resistor 548 ("R") is connected between the negative input ("−") and ground. In this configuration, with resistor values "R" and "$\alpha$R" as shown, a signal at the output of the operational amplifier is representative of the desired load current multiplied by the scale factor (1+$\alpha$), i.e., ("Demand(1+$\alpha$)").

FIG. 6A is a block diagram 600A of another circuit for generating a controlling signal for the power supply. A signal representative of the desired load current ("Demand") is presented at a first input 632 of a scaling element 630. A scale factor ("1+$\alpha$") is applied via a second input 634 of the scaling element 630. The scaling element 630 produces an output signal representative of the desired load current multiplied by the scale factor ("Demand(1+$\alpha$)"), which is in turn connected to a first input 622 of a summing element 620. A signal representative of an offset amount "$\Delta$" is presented at a second input 624 of the summing element 620. The summing element 620 produces an output signal 626 representative of the sum of the two signals at its inputs 622 and 624, or ("Demand(1+α)+Δ").

FIG. 6B is a schematic diagram of a circuit realization 600B generally equivalent to the block diagram of FIG. 6A. An operational amplifier 640 has a first input resistor 442 ("RA") and a second input resistor 644 ("RB") connected to a positive input ("+") thereof. A signal representative of the desired load current ("Demand") is provided to the operational amplifier 640 via the first input resistor 642 and a signal representative of an offset amount "Bias" is provided via the second input resistor 644. A first feedback network resistor 646 ("RC") is connected between an output of the operational amplifier 640 and a negative input ("−") thereof. A second feedback network resistor 648 ("RD") is connected between the negative input ("−") and ground. In this configuration, assuming resistor values "RA", "RB", "RC" and "RD" as shown signal at the output of the operational amplifier is represented by the expression below:

$$\text{Output} = \frac{\text{Demand} \cdot RB + \text{Bias} \cdot RA}{RA + RB}\left(1 + \frac{RC}{RD}\right)$$

Converting to the equivalent notation used in FIG. 6A:

$$\alpha = \frac{RB(RC+RD)}{(RA+RB)RD} - 1$$

$$\Delta = \text{Bias} \cdot \frac{RA(RC+RD)}{(RA+RB)RD}$$

Those of ordinary skill in the art will understand that there are many other ways to generate the signal ("Demand+Δ") that controls the output of the current-regulated power supply, including the use of virtual ground summing stages. Those of ordinary skill in the art will also recognize that suitable current-regulated power supplies can be designed to be responsive to many different types of controlling signal, e.g., a control voltage or a controlling current.

The present inventive technique provides a combination of good efficiency, low noise, lower-cost components, and high reliability.

Although the invention has been illustrated and described in detail in the drawings and foregoing description, the same is to be considered as illustrative and not restrictive in character—it being understood that only preferred embodiments have been shown and described, and that all changes and modifications that come within the spirit of the invention are desired to be protected. Undoubtedly, many other "variations" on the "themes" set forth hereinabove will occur to one having ordinary skill in the art to which the present invention most nearly pertains, and such variations are intended to be within the scope of the invention, as disclosed herein.

What is claimed is:

1. A low-noise current source driver for a laser diode load, including a current-regulated supply connected across the load, and a shunt regulator, said shunt regulator comprising:
   a shunting element, a current sensing element for sensing current conducted through the load, and an error amplifier responsive to a difference between the current sensed by the current sensing element and a signal representative of first reference current,
   wherein:
   the current-regulated supply is responsive to a signal representative of a second reference current to produce an output current corresponding thereto,
   the shunting element is connected across the power supply and load, and is controlled by the error amplifier to conduct all current from the current regulated supply in excess of the first reference current, and
   the second reference current is greater than the first reference current.

2. Low-noise current source driver, according to claim 1, wherein:
   the shunting element is a field-effect transistor (FET).

3. Low-noise current source driver, according to claim 1, wherein:
   the shunting element is a bipolar transistor.

4. Low-noise current source driver, according to claim 1, wherein:
   the current sensing element is a small-value resistor.

5. Low-noise current source driver, according to claim 1, wherein:
   the current sensing element is a Hall-effect sensing device.

6. Low-noise current source driver, according to claim 1, wherein:
   the second reference current is greater than the first reference current by a fixed amount.

7. Low-noise current source driver, according to claim 1, wherein:
   the second reference current is greater than the first reference current by a fixed proportion.

8. Low-noise current source driver, according to claim 1, wherein:
   the second reference current is greater than the first reference current by an amount equal to the sum of a fixed portion of the first reference current and a fixed amount.

9. Low-noise current source driver, according to claim 1, wherein:
   the second reference current is greater than the first reference current by an amount greater than or equal to the ripple and noise currents in the output of the current-regulated supply.

10. A low-noise current source driver comprising:
    a power supply having an output supplying a current to a first of two terminals of a load, and an input for receiving a reference signal ("Demand+Δ") which is greater than a desired current ("Demand") through the load;
    a sensing element connected between a second of two terminals of the load, and ground;
    an error amplifier having a first input connected to the second load terminal, a second input of the error amplifier for receiving a signal indicative of the desired current ("Demand") through the load; and
    an FET having its gate connected to the output of the error amplifier, and its source and drain connected between the output of the power supply and ground, for bypassing current around the load.

11. Low-noise current source driver, according to claim 10, wherein:
    the load is one or more laser diodes.

12. A method of driving current into a load, comprising:
    connecting a current-regulated supply connected across the load;
    connecting a shunting element across the load; and
    controlling the shunting element to conduct all current from the current-regulated supply in excess of a first reference current.

13. Method, according to claim 12, further comprising:

sensing current conducted through the load and controlling the shunting element in response thereto.

14. Method according to claim 12, wherein:

the load is a laser diode load.

15. Method according to claim 12, wherein:

the shunting element is an FET.

16. Method, according to claim 12, further comprising:

controlling the output of the current-regulated supply with a signal indicative of a second reference current.

17. Method according to claim 16, wherein:

setting the second reference current to be greater than the first reference current by a fixed amount.

18. Method according to claim 16, wherein:

setting the second reference current to be greater than the first reference current by a fixed proportion.

19. Method according to claim 16, wherein:

setting the second reference current to be greater than the first reference current by an amount equal to the sum of a fixed portion of the first reference current and a fixed amount.

20. Method according to claim 16, wherein:

the second reference current is greater than the first reference current by an amount greater than or equal to the ripple and noise currents in the output of the current-regulated supply.

* * * * *